US011037911B2

(12) United States Patent
Yamada

(10) Patent No.: US 11,037,911 B2
(45) Date of Patent: Jun. 15, 2021

(54) LIGHT EMITTING DEVICE

(71) Applicant: NICHIA CORPORATION, Anan (JP)

(72) Inventor: Motokazu Yamada, Tokushima (JP)

(73) Assignee: NICHIA CORPORATION, Anan (JP)

(*) Notice: Subject to any disclaimer, the term of this patent is extended or adjusted under 35 U.S.C. 154(b) by 263 days.

(21) Appl. No.: 16/230,591

(22) Filed: Dec. 21, 2018

(65) Prior Publication Data

US 2019/0198484 A1 Jun. 27, 2019

(30) Foreign Application Priority Data

Dec. 27, 2017 (JP) .............................. JP2017-250606
Dec. 12, 2018 (JP) .............................. JP2018-232286

(51) Int. Cl.
*H01L 25/075* (2006.01)
*H01L 33/46* (2010.01)
*H01L 33/20* (2010.01)
*H01L 33/62* (2010.01)

(52) U.S. Cl.
CPC .......... *H01L 25/0753* (2013.01); *H01L 33/20* (2013.01); *H01L 33/46* (2013.01); *H01L 33/62* (2013.01); *H01L 2933/0091* (2013.01)

(58) Field of Classification Search
None
See application file for complete search history.

(56) References Cited

U.S. PATENT DOCUMENTS

| 5,990,497 | A * | 11/1999 | Kamakura | H01L 33/16 257/94 |
| 6,858,881 | B2 * | 2/2005 | Eisert | H01L 33/20 257/103 |
| 8,344,403 | B2 * | 1/2013 | Niki | H01L 21/02647 257/98 |
| 9,263,636 | B2 * | 2/2016 | Tarsa | H01L 24/32 |
| 10,401,557 | B2 * | 9/2019 | Kim | H01L 33/56 |
| 10,720,412 | B2 * | 7/2020 | Hayashi | H01L 25/0753 |

(Continued)

FOREIGN PATENT DOCUMENTS

| JP | 2002-374004 A | 12/2002 |
| JP | 2008-109098 A | 5/2008 |

(Continued)

*Primary Examiner* — David E Graybill
(74) *Attorney, Agent, or Firm* — Global IP Counselors, LLP

(57) ABSTRACT

A light emitting device includes a wiring substrate, light emitting elements, light-reflecting films, and a light diffusing member. The light emitting elements are mounted in a matrix on the wiring substrate. Each of the light emitting elements includes a sapphire substrate having a lower surface, first lateral surfaces inclined to the lower surface, and second lateral surfaces perpendicular to the lower surface, and a semiconductor layered structure disposed on the lower surface. The light-reflecting films are respectively disposed on the light emitting elements. The light diffusing member is disposed above the light emitting elements. At least a group of the light emitting elements is arranged such that, in every adjacent ones of the light emitting elements in at least one of a row direction and a column direction, the first lateral surface of the light emitting element faces the second lateral surface of the adjacent light emitting element.

11 Claims, 8 Drawing Sheets

(56) References Cited

U.S. PATENT DOCUMENTS

| | | | |
|---|---|---|---|
| 2006/0108598 A1* | 5/2006 | Lai | H01L 33/32 |
| | | | 257/103 |
| 2008/0251796 A1* | 10/2008 | Lee | H01L 33/32 |
| | | | 257/88 |
| 2008/0258156 A1 | 10/2008 | Hata | |
| 2009/0242909 A1* | 10/2009 | Onikiri | G02B 6/0023 |
| | | | 257/88 |
| 2010/0267181 A1* | 10/2010 | Niki | H01L 33/38 |
| | | | 438/46 |
| 2010/0308437 A1* | 12/2010 | Okuno | H01L 21/0242 |
| | | | 257/615 |
| 2012/0092389 A1 | 4/2012 | Okuyama | |
| 2012/0292642 A1 | 11/2012 | Urata et al. | |
| 2014/0312379 A1* | 10/2014 | Lee | H01L 33/385 |
| | | | 257/99 |
| 2016/0240518 A1 | 8/2016 | Hayashi et al. | |
| 2016/0343918 A1* | 11/2016 | Yamada | H01L 33/54 |
| 2016/0349445 A1* | 12/2016 | Kim | H01L 33/56 |
| 2017/0162755 A1* | 6/2017 | Su | H01L 24/10 |
| 2019/0198484 A1* | 6/2019 | Yamada | H01L 33/46 |

FOREIGN PATENT DOCUMENTS

| | | |
|---|---|---|
| JP | 2012-089572 A | 5/2012 |
| JP | 2013-110439 A | 6/2013 |
| JP | 6156402 B2 | 7/2017 |
| WO | 2011090024 A1 | 7/2011 |

* cited by examiner

LIGHT EMITTING DEVICE

CROSS-REFERENCE TO RELATED PATENT APPLICATION

This application claims priority to Japanese Patent Application No. 2017-250606 filed on Dec. 27, 2017, and Japanese Patent Application No. 2018-232286 filed on Dec. 12, 2018. The entire disclosures of Japanese Patent Application No. 2017-250606 and Japanese Patent Application No. 2018-232286 are hereby incorporated herein by reference.

BACKGROUND

Technical Field

The present disclosure relates to a light emitting device.

Description of Related Art

When a plurality of LED elements of the same structure are arranged regularly in the same orientation in a conventional LED array panel and the luminous intensity distributions of the light emitted from the LED elements exhibit a certain pattern, the certain pattern of light from the plurality of LED elements may be overlapped when condensed, resulting in uneven illuminance which may further resulting in projecting an image on a screen.

In order to obtain a uniform luminous intensity distribution on the irradiated surface, the plurality of light emitting elements in the LED array panel may be arranged at angles different by 90° around the optical axis, such that light emitted from the light emitting elements with luminous intensity distribution exhibiting a certain pattern is overlapped to produce a uniform luminous intensity distribution, which is, for example, proposed in Japanese Unexamined Patent Application Publication No. 2002-374004.

SUMMARY OF THE INVENTION

Meanwhile, in a direct-type or direct-lit backlight light source, a plurality of light emitting elements are generally arranged in the same orientation in a matrix of rows and columns at a uniform pitch. In such a configuration, when unevenness in luminance occurs around a single light emitting element, the same or similar unevenness in luminance would successively continue in the rows or the columns, which may be visually recognized on the light-emitting surface of the backlight light source. Such a visually recognizable unevenness in luminance on the light-emitting surface of the backlight light source tends to be inherited on the irradiated surface of a liquid crystal panel etc.

Accordingly, an aim of the present disclosure is to provide a light emitting device in which a plurality of light emitting elements having a specific three-dimensional shape and specific light distribution characteristics are arranged in a matrix of rows and columns at a uniform pitch, successively continuing unevenness in luminance along rows and/or columns is not or hardly visually recognized on the light emitting surface and/or on the irradiated surface.

The embodiments include the aspects described below.

A light emitting device includes a wiring substrate, a plurality of light emitting elements, a plurality of light-reflecting films, and a light diffusing member. The wiring substrate has light-reflecting properties. The wiring substrate includes a wiring. The light emitting elements are mounted in a matrix of rows and columns on an upper surface of the wiring substrate. Each of the light emitting elements includes a sapphire substrate having a lower surface, a pair of first lateral surfaces inclined to the lower surface, and a pair of second lateral surfaces perpendicular to the lower surface, and a semiconductor layered structure disposed on the lower surface of the sapphire substrate. The light-reflecting films are respectively disposed on upper surfaces of the light emitting elements. The light diffusing member is disposed above the light emitting elements. At least a group of the light emitting elements disposed in a predetermined region is arranged such that, in every adjacent ones of the light emitting elements in at least one of a row direction and a column direction of the matrix, one of the pair of first lateral surfaces of one of the light emitting elements faces one of the pair of second lateral surfaces of an adjacent one of the light emitting elements.

According to the present disclosure, a light emitting device having a plurality of light emitting elements of certain structure and certain light distribution characteristics arranged in a matrix of rows and columns with a number of rows and a number of columns at a uniform pitch, visual recognition of unevenness in luminance along rows and/or columns can be effectively prevented or reduced.

DETAILED DESCRIPTION OF EMBODIMENTS

Figure 1A:
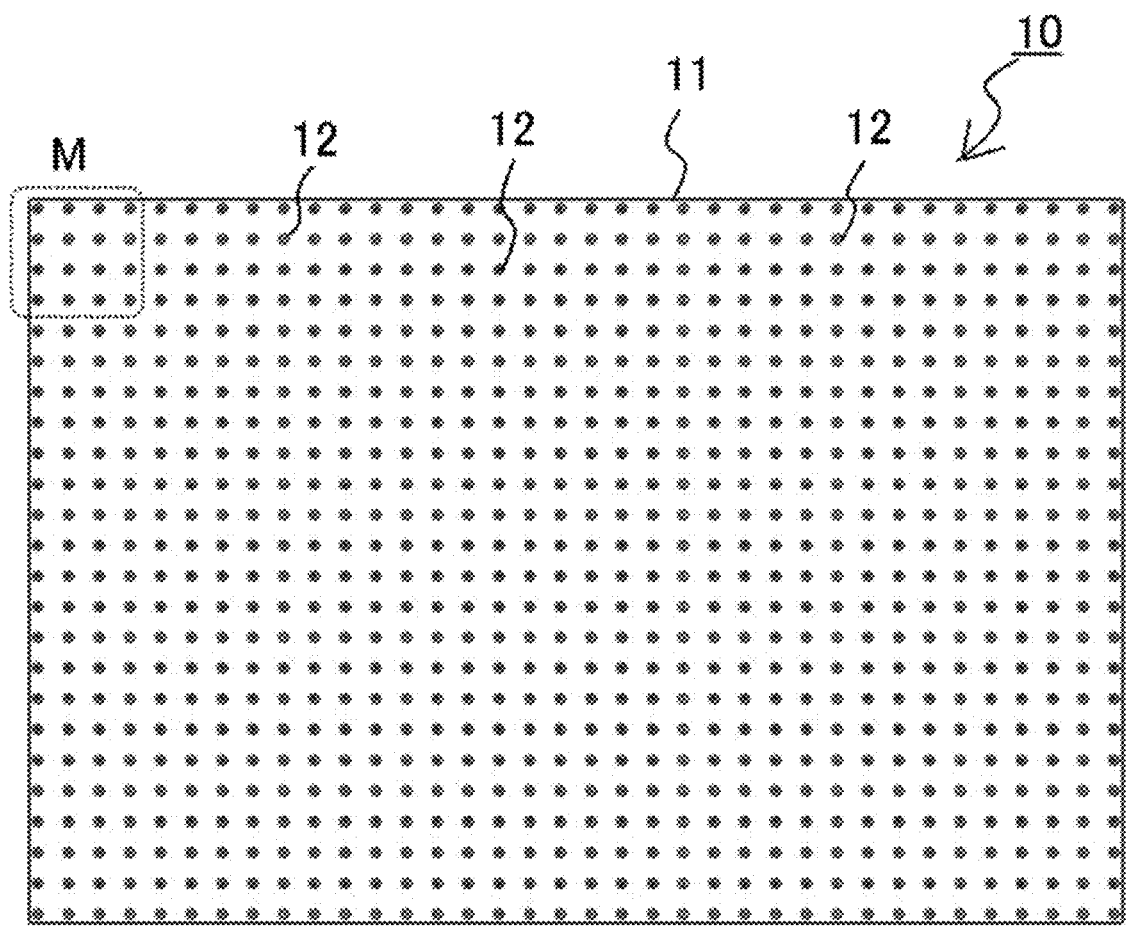
FIG. 1A is a schematic plan view showing a light emitting device according to one embodiment.

The embodiments shown below are intended as illustrative to give a concrete form to technical ideas of the present invention, and the scope of the invention is not limited to those described below. The sizes and the positional relationships of the members in each of the drawings are occasionally shown exaggerated for ease of explanation. Further, in the description below, the same designations or the same reference numerals denote the same or like members and duplicative descriptions will be appropriately omitted.

Light Emitting Device

Figure 1B:
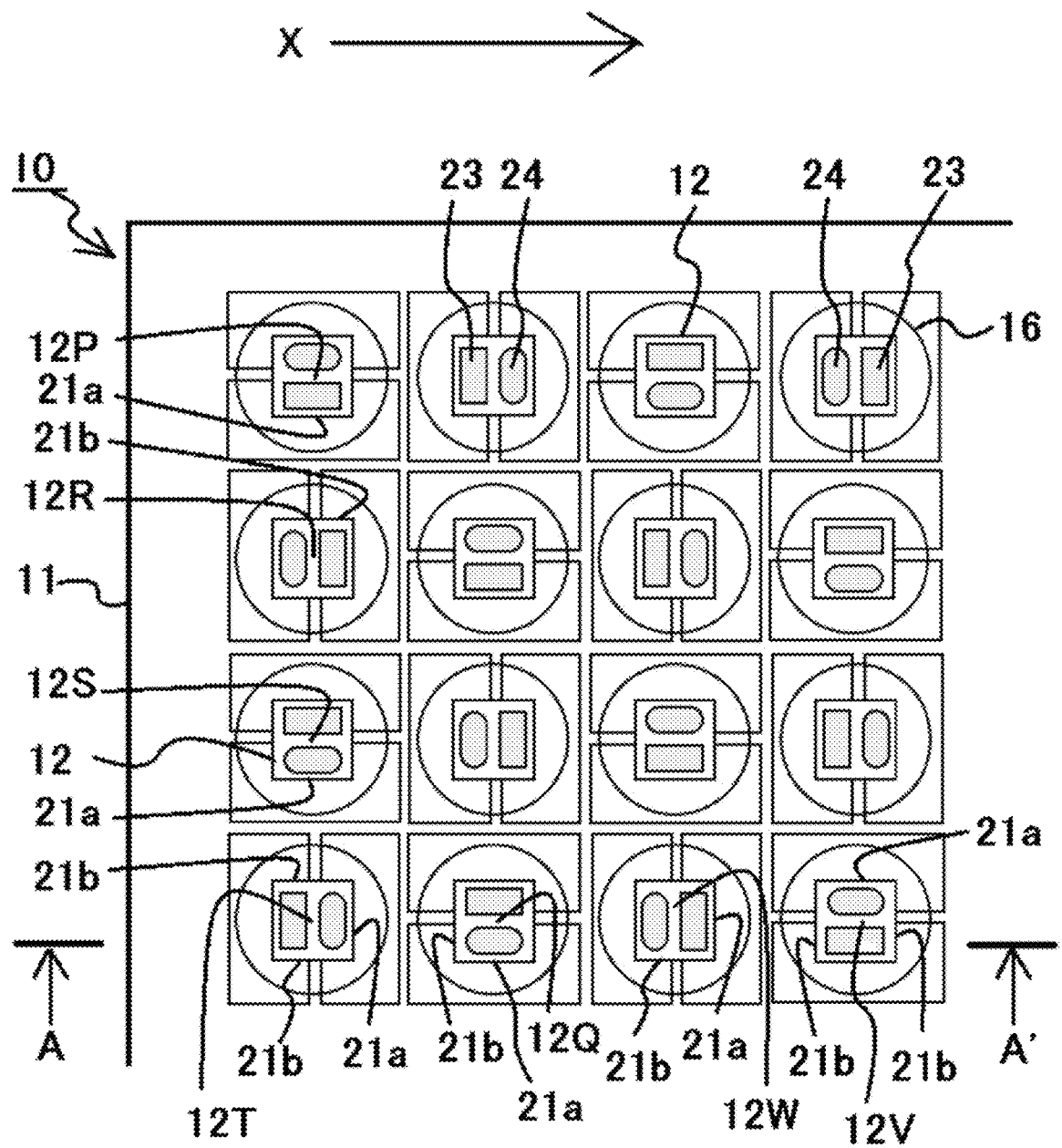
FIG. 1B is an enlarged schematic plan view illustrating an arrangement of light emitting elements in a region M in FIG. 1A.
Figure 1C:
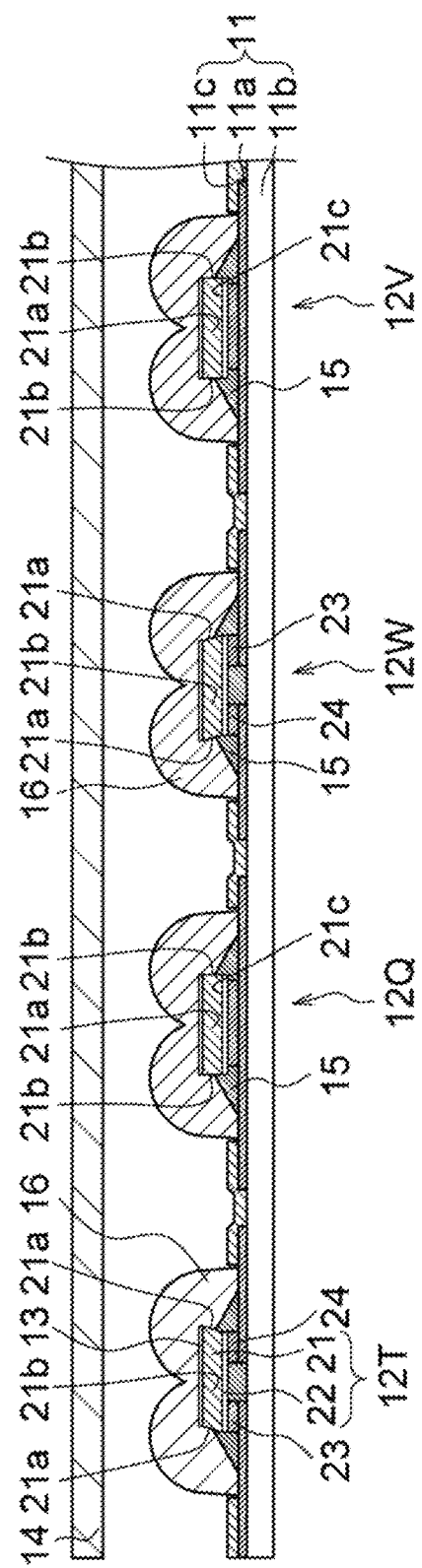
FIG. 1C is a schematic cross-sectional view taken along line A-A' of FIG. 1B.
Figure 4:
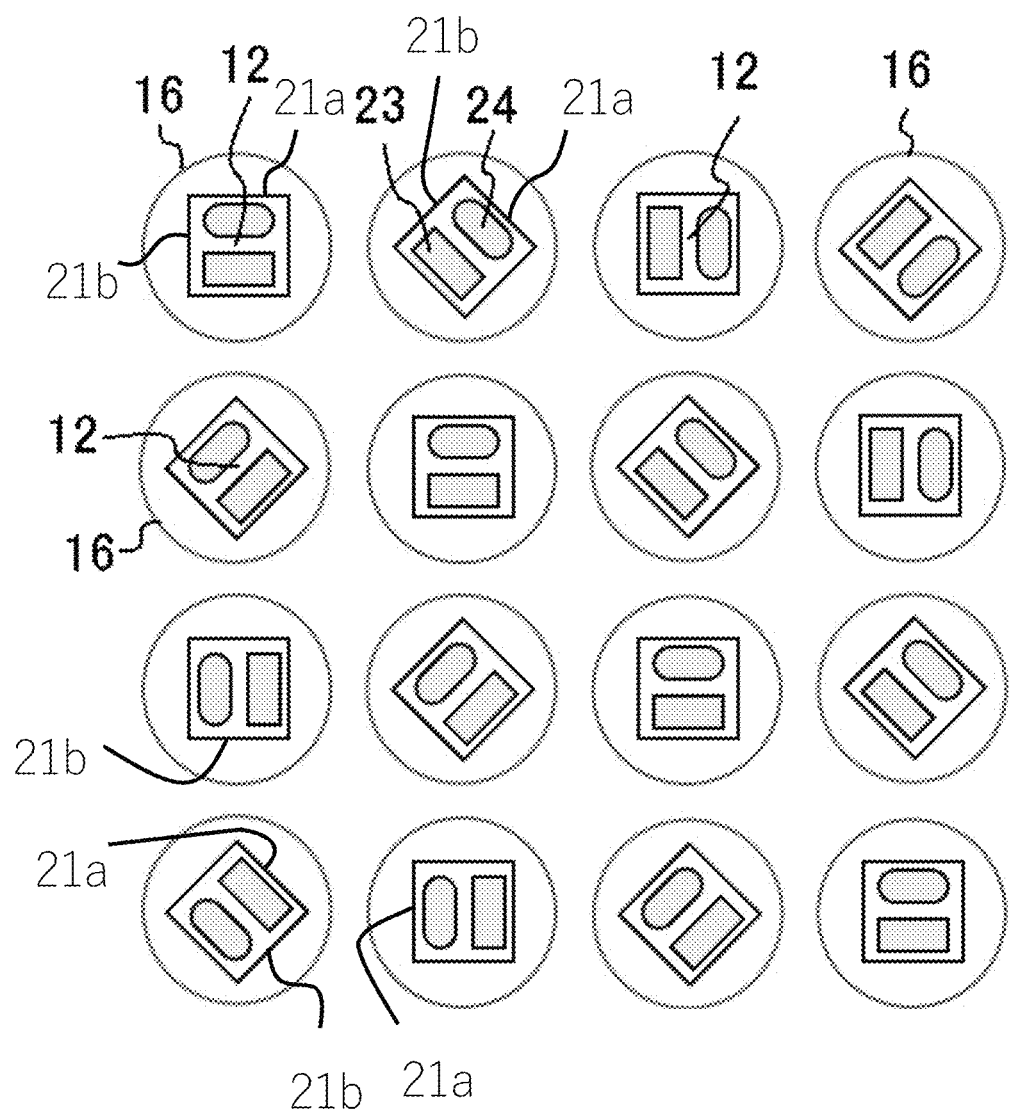
FIG. 4 is a schematic plan view illustrating an arrangement of light emitting elements in the region M of a light emitting device according to yet another embodiment.

As shown in FIG. 1A, a light emitting device 10 according to one embodiment of the present invention includes a plurality of light emitting elements 12 arranged in a matrix of rows and columns on an upper surface of a wiring substrate 11. In the light emitting device 10, as shown in FIG. 1B and FIG. 1C, the wiring substrate 11 includes a wiring 11a on a substrate 11b and the wiring substrate 11 has light-reflecting properties. A light-reflecting film 13 is disposed on an upper surface of each of the light emitting elements 12, and a light diffusing member 14 is disposed above the plurality of light emitting elements 12. Each of the light emitting elements 12 includes a sapphire substrate 21 and a semiconductor layered structure 22. The sapphire substrate 21 has a lower surface 21c, a pair of first lateral surfaces 21a inclined to the lower surface 21c, and a pair of second lateral surfaces 21b perpendicular to the lower surface 21c. A part of the plurality of light emitting elements 12 disposed in a predetermined region, for example, a region M in FIG. 1, are arranged such that one of the pair of first lateral surfaces 21a of one of the light emitting elements 12 faces one of the pair of second lateral surfaces 21b of an adjacent one of the light emitting elements 12 among the plurality of light emitting elements 12 in at least one of a row direction and a column direction. In the present specification, the expressions "one surface faces another surface" and "two surfaces face each other" refer to a state in which the two surfaces are generally facing toward each other, and is not limited to a state in which the two surfaces are precisely in parallel to each other. More specifically, the expressions "one surface faces another surface" and "two surfaces face each other" include a state in which one of the facing surfaces is inclined to the other of the facing surfaces, for example, as shown in FIG. 4.

The direction of light emitted from a light emitting element is affected by the pair of first lateral surfaces inclined due to a cleavage plane of the sapphire substrate, but with the configuration as described above, the directions of light emitted from the light emitting elements can be set in different directions between adjacent light emitting elements arranged in the row direction or in the column direction. Accordingly, successively continuing brighter pattern and successively continuing darker pattern that occur when arranging regularly and in the same orientation a plurality of light emitting elements each having a relatively brighter side and a relatively darker side when viewed from above can be effectively avoided. Accordingly, in the light emitting device, uniform intensity distribution of light can be obtained on the light emitting surface and visual recognition of unevenness in the luminance can be avoided. Such effects can be more significantly achieved by providing a light-reflecting film on the upper surface of each of the light emitting elements, in applications in which a great number of light emitting elements each substantially does not allow light to pass through in a direction perpendicular to the upper surface are disposed, particularly in an application for direct-type backlight light source.

Wiring Substrate 11

The wiring substrate 11 has at least one surface (for example an upper surface) provided with a wiring 11a. The wiring 11a includes a plurality of pairs of patterns each corresponding to positive and negative electrodes of the light emitting elements. The pairs of patterns each corresponding to positive and negative electrodes are respectively electrically connected to a first surface, inside and/or a second surface opposite to the first surface (for example, a lower surface) of the wiring substrate 11 to supply electric current (electric power) from the outside.

Wiring 11a

The material of the wiring 11a can be appropriately selected based on the material of the substrate 11b, a method of manufacturing, or the like. For example, when ceramics is used for the material of the substrate 11b, the wiring 11a is preferably made of a material having a high melting point durable at a calcination temperature of ceramics sheet, examples thereof include a high-melting point metal such as tungsten, molybdenum, or the like. The substrate 11b may further be coated with a metal material such as nickel, gold, silver, or the like by way of plating, sputtering, or vapor deposition.

When a resin material such as a glass-epoxy resin is used for the substrate 11b, the wiring 11a is preferably made of a material that is easily processed. The wiring 11a can be formed on an upper surface or/and a lower surface of the substrate 11b by plating, vapor deposition, sputtering, printing, coating, or the like. Alternatively, for the wiring 11a, a thin metal film may be attached by pressing, or pattern of predetermined shape may be formed by applying a mask by way of printing, photolithography, or the like, and then performing etching. For example, a metal such as copper, silver, gold, or nickel, or an alloy of those may be used.

Substrate 11b

The substrate 11b can be made of; for example, ceramics, a resin material such as a glass-epoxy resin, a phenol resin, an epoxy resin, a polyimide resin, a BT resin, a polyphthalamide (PPA), or polyethylene terephthalate (PET), or a metal.

The substrate 11b can have an appropriate thickness.

Examples of the ceramics include alumina, mullite, forsterite, glass-ceramics, nitride-based (for example, AlN) ceramics, carbon-based (for example, SiC) ceramics, and low temperature co-fired ceramics (LTCC).

When a resin material is used, an inorganic filler such as glass-fiber, $SiO_2$, $TiO_2$, $Al_2O_3$ or the like may be mixed in a resin material to improve in mechanical strength, to decrease in thermal expansion coefficient, to improve optical reflectance, or the like.

Examples of the metal include copper, iron, nickel, chromium, aluminum, silver, gold and titanium and alloys of those.

Covering Layer 11c

The wiring substrate 11 has light-reflecting properties, but the light-reflecting properties may be provided by the wiring 11a on the wiring substrate 11, or provided by the substrate 11b made by a material that has light-reflecting properties, or provided by a covering layer 11c that has light-reflecting properties and applied on the upper surface of the wiring substrate 11 in a region other than the wirings to be electrically connected to the light emitting element. Of those, the light-reflecting properties is preferably provided by the covering layer 11c that has light-reflecting properties.

Preferable examples of the materials of the covering layer 11c that covers the wiring substrate 11 include a resin material described above containing a light-reflecting material, and an electrically insulating resist. Examples of the light-reflecting material include white pigments such as titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide, and zirconium oxide. For the light-reflecting material, one of the above may be used alone or two or more of the above may be used in combination. The content amount of the light-reflecting material in a resin material is, in view of light-reflecting properties and viscosity in a fluid state, or the like, preferably in a range of 10 to 70 wt %, more preferably in a range of 30 to 60 wt %.

Light Emitting Element 12 and Light-Reflecting Film 13

Each of the plurality of light emitting elements 12 includes, as shown in FIG. 1C, a sapphire substrate 21 and a semiconductor layered structure 22 disposed on a lower surface 21c of the sapphire substrate 21. The lower surface of the semiconductor layered structure 22 is provided with positive and negative electrodes 23, 24. A light-reflecting film 13 is disposed on a surface of the sapphire substrate 21 that is opposite to the lower surface 21c of the sapphire substrate 21.

The light emitting elements 12 may have a quadrangular shape or a shape approximate to a quadrangular shape such as a quadrangular shape with rounded corners, but other appropriate planar shape may be employed.

Sapphire Substrate 21

Each of the sapphire substrates 21 has a lower surface 21c, a pair of first lateral surfaces 21a inclined to the lower surface 21c, and a pair of second lateral surfaces 21b perpendicular to the lower surface 21c. That is, a cross-section passing the lower surface 21a and the pair of first lateral surfaces 21a in each of the sapphire substrates 21, one of the pair of first lateral surfaces 21a forms an acute angle with the lower surface 21a and the other of the pair of first lateral surfaces 21a forms an obtuse angle with the lower surface 21a. As long as the lateral surfaces meet the configuration requirements described above, for example, a substrate made of hexagonal $Al_2O_3$, which is a sapphire substrate having a principal surface of C-plane, A-plane, R-plane or M-plane, or a plane with an off angle of about ±5° with respect to one of those planes, can be used. For example, a C-plane sapphire or a sapphire having a lower surface 21c with an off angle of ±5° with respect to C-plane can be used. Although the sapphire is not perfectly hexagonal in shape, the sapphire is known to be approximately hexagonal (hexagonal system).

When the lower surface 21c is C-plane (0001), the first lateral surfaces 21a may be, for example, (1-100) plane, (01-10) plane, (-1010) plane, or the like, which is, when seen from C-plane in [0001] direction, with an inclination in [-1100] direction, [-1100] direction, or [0-110] direction, respectively. The inclination of the first lateral surfaces 21a with respect to the lower surface 21c may be, for example, in a range of 1° to 20°, preferably in a range of 2° to 10°. In FIG. 1C, the first lateral surfaces 21a are substantially parallel to each other and inclined, for example, at 90±7° to the lower surface 21c. That is, one of the pair of the first lateral surfaces 21a is inclined at an acute angle (for example, 83°) to the lower surface 21c and the other of the pair of the first lateral surfaces 21a is inclined at an obtuse angle (for example, 97°) to the lower surface 21c.

Semiconductor Layered Structure 22

Any semiconductor layered structure 22 which can emit light of predetermined wavelength can be employed. For example, a light emitting element for emitting light of blue color or green color, a nitride-based semiconductor ($In_xAl_yGa_{1-x-y}N$, $0 \leq X$, $0 \leq Y$, $X+Y \leq 1$) can be used. The size and the number of the light emitting elements can be selected appropriately according to purpose.

The positive and negative electrodes 23 and 24 respectively correspond to anode and cathode, and one or plurality of each may be disposed. In FIG. 1B, each of the light emitting elements 12 is provided with one each of the electrodes 23 and 24 respectively corresponding to anode and cathode.

Each of the electrodes 23 and 24 can be formed in an appropriate shape by using an electrically conductive material.

The positive and negative electrodes 23 and 24 are respectively electrically connected via a bonding member to the wiring 11a on the upper surface of the wiring substrate 11, as shown in FIG. 1C. That is, each of the light emitting elements 12 is mounted in a flip-chip manner, bridging positive and negative wiring 11a.

Examples of materials of the bonding member include, bumps made of gold, silver, or copper, a metal paste including a metal powder of silver, gold, or copper and a resin binder, solders such as tin-bismuth-based solders, tin-copper-based solders, and brazing materials such as low-melting-point metals.

Light-Reflecting Layer 13

Figure 2A:
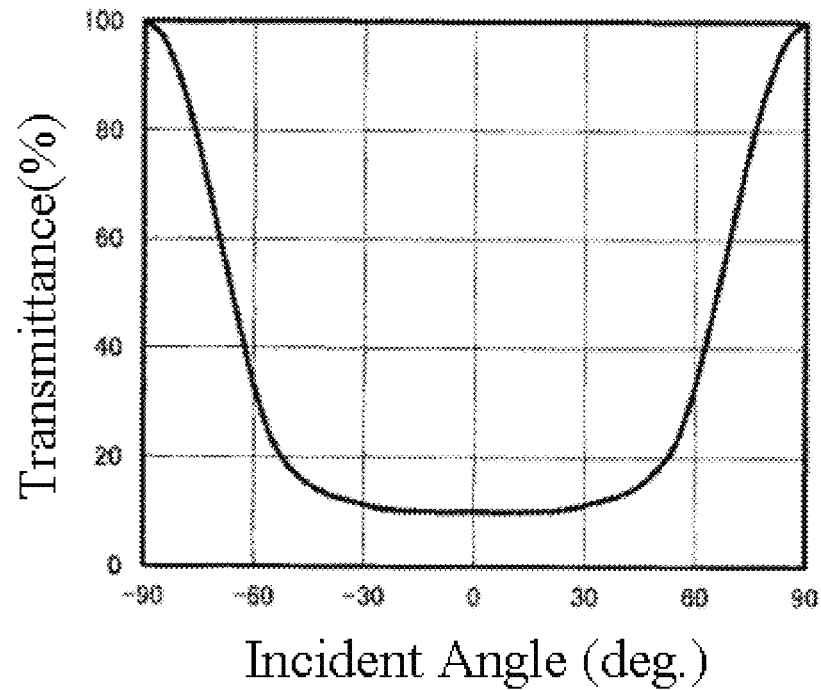
FIG. 2A is a graph showing light-transmissive characteristics of a light-reflecting film.

In each of the light emitting element 12, a light-reflecting film 13 is disposed on the surface of the sapphire substrate 21 that is opposite to the lower surface 21c of the sapphire substrate 21. The reflecting Film 13 preferably has an incident angle dependence of reflectance for a light emission wavelength of the light emitting element 12. The optical transmittance of the light-reflecting film 13 is dependent on an incident angle, such that as shown in FIG. 2A, substantially no light is transmitted in the normal direction to the upper surface of the light emitting element 12 but the optical transmittance increases with increasing inclination angle with respect to the normal direction. For example, when the optical transmittance is about 10% to light of an incident angle in a range of −30° to 30°, but the optical transmittance gradually increases to light of incident angle smaller than −30° and rapidly increases to light of incident angle smaller than −50°. Similarly, when the incident angle of light is greater than 30°, the optical transmittance gradually increases and when the incident angle of light is greater than 50°, the optical transmittance rapidly increases. That is, the light transmittance of the light-reflecting film 13 to light from the light emitting element 12 increases as increasing the absolute value of the incident angle. Accordingly, each of the light emitting elements 12 having the light-reflecting film 13 exhibits batwing light distribution as shown in FIG. 2B in a direction parallel to the second lateral surfaces 21b of the sapphire substrate 21 (i.e., a direction of the light emitting elements 12T and 12W parallel to the plane of FIG. 1C) and also exhibits batwing light distribution as shown in FIG. 2C in a direction perpendicular to the second lateral surfaces 21b of the sapphire substrate 21 (i.e., a direction of the light emitting elements 12Q and 12V parallel to the plane of FIG. 1C).

Figure 2B:
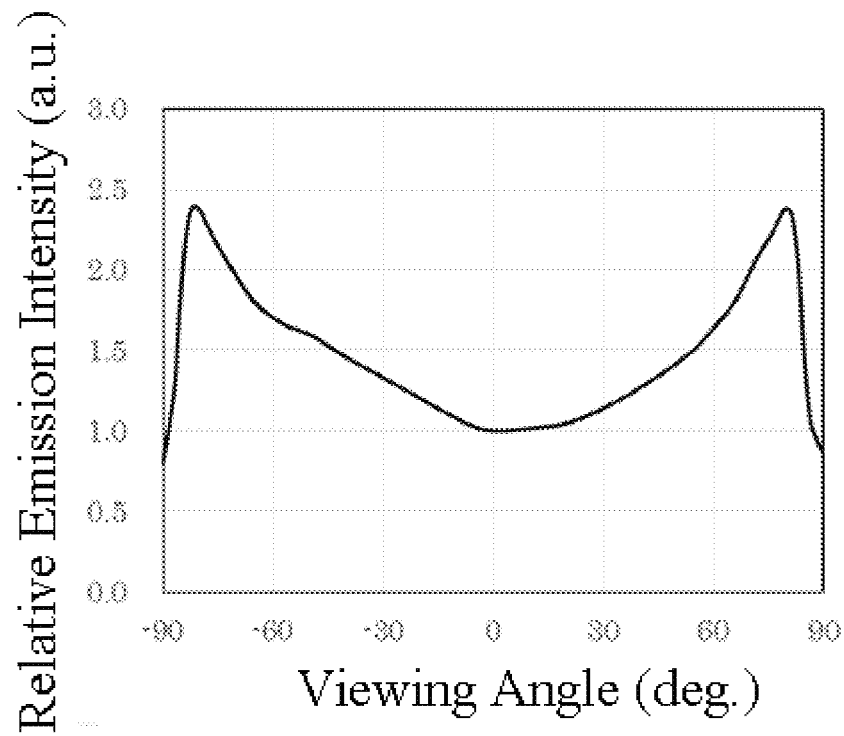
FIG. 2B is a graph showing light distribution characteristics of a light emitting element 12T, in X-direction of FIG. 1B.
Figure 2C:
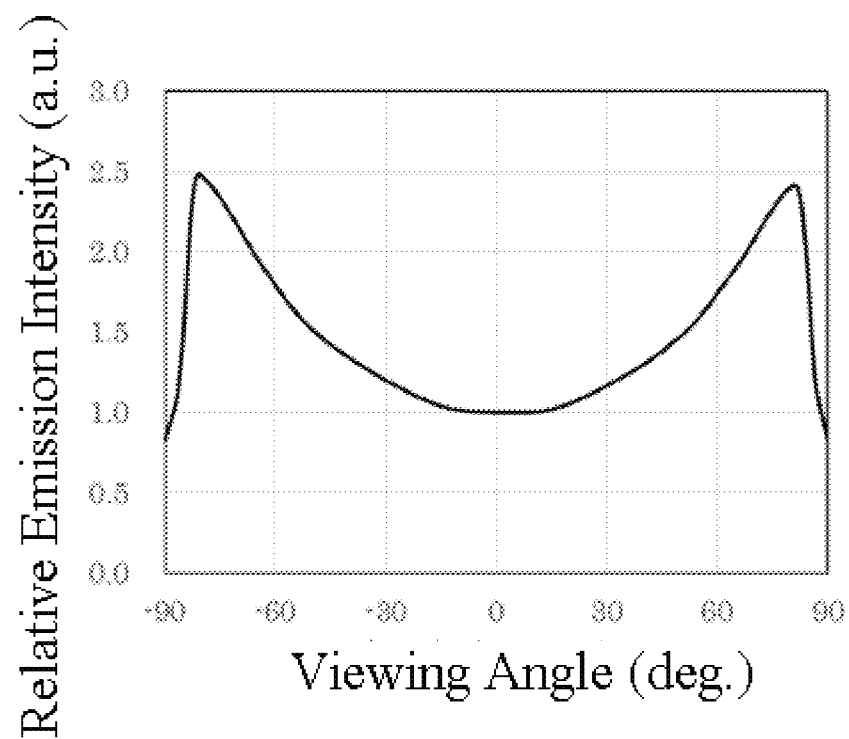
FIG. 2C is a graph showing light distribution characteristics of the light emitting element 12T, in a direction perpendicular to X-direction of FIG. 1B.

The batwing light distribution shown in FIG. 2B is asymmetrical with respect to the viewing angle of zero, due to the inclination of the first lateral surfaces 21a of the sapphire substrate 21. Meanwhile, the batwing light distribution shown in FIG. 2C is symmetrical with respect to the viewing angle of zero, because the second lateral surfaces 21b of the sapphire substrate 21 are perpendicular.

A batwing light distribution refers to light distribution characteristics having a first intensity peak that is greater intensity than the intensity at a light distribution angle of 90°, in a first region in which a light distribution angle is equal or less than 90°, and a second intensity peak that is greater intensity than the intensity at a light distribution angle of 90°, in a second region in which a light distribution angle is equal or greater than 90°.

With adapting light having such batwing light distribution characteristics, the bitch between the light emitting elements in the matrix direction can be increased, and thus the number of the light emitting elements can be reduced.

The light-reflecting film 13 is provided to reflect at least light emitted from the light emitting element 12 and made of, for example, a metal material, a resin material containing a white filler, or a dielectric multilayer film.

When a dielectric multilayer film is used, a light-reflecting film exhibiting small absorption of light can be obtained, which facilitates adjustment of reflectance in a design stage of the film. Further, the reflectance can be accurately adjusted by the incident angle of light. In particular, the batwing light distribution characteristics described above can be obtained with good control by increasing the reflectance in a direction perpendicular to the light extracting surface (in other words, in an axis direction) and decreasing the reflectance (that is, increasing light transmittance) in a direction that has a large angle to the optical axis.

Each of the light emitting elements 12 according to the present embodiment includes the sapphire substrate 21 having the first lateral surfaces 21a and the second lateral surfaces 21b as described above. That is, the light distribution characteristics of emission is affected by the pair of first lateral surfaces 21a inclined due to a cleavage plane of the sapphire substrate 21, which produce relatively brighter side and relatively darker side when viewed from above.

The plurality of light emitting elements 12 are, as shown in FIG. 1A, disposed on the upper surface of the wiring substrate 11 in plurality of rows and/or plurality of columns, in which, a part of the plurality of light emitting elements in a predetermined region, for example, a region M in FIG. 1A, are arranged such that one of the pair of first lateral surfaces 21a and one of the pair of second lateral surfaces 21b of adjacent light emitting elements 12 of the plurality of light emitting elements 12 in at least one of a row direction and a column direction are facing each other. In particular, the light emitting elements 12 in the predetermined region are preferably arranged such that the first lateral surface 21a of the sapphire substrate 12 and the second lateral surface 21b of the sapphire substrate 12 of adjacent light emitting elements 12 in the row direction and in the column direction are facing with each other.

For example, as shown in FIG. 1B and FIG. 1C, the plurality of light emitting elements 12 are regularly disposed in a matrix direction, in which, in a predetermined region M, for example, the first lateral surface 21a of the sapphire substrate 21 of the light emitting element 12T faces the second lateral surface 21b of the sapphire substrate 21 of the light emitting element 12Q that is adjacent to the light emitting element 12T in the row direction (X-direction in FIG. 1B). The second lateral surface 21b of the sapphire substrate 21 of the light emitting element 12Q faces the first lateral surface 21a of the sapphire substrate 21 of the light emitting element 12W that is adjacent to the light emitting element 12Q in the row direction. As shown in FIG. 1C, the pair of first lateral surfaces 21a of the sapphire substrate 21 of the light emitting element 12T are inclined in the opposite direction to the inclination of the first lateral surfaces 21a of the sapphire substrate 21 of the light emitting element 12W. In other words, as shown in FIG. 1B, the light emitting elements 12 are disposed such that in the row direction along the X direction (from the left side to the right side in FIG. 1B), one of the pair of first lateral surfaces 21a of adjacent light emitting elements 12 are rotated by 90° to the right. In other words, among every two adjacent light emitting elements 12 in the row direction, the orientation of the light emitting element 12 on the right side is rotated by 90° to the right with respect to the orientation of the light emitting element 12 on the left side.

In a similar manner, the first lateral surface 21a of the sapphire substrate 21 of the light emitting element 12P faces the second lateral surface 21b of the sapphire substrate 21 of the light emitting element 12R that is adjacent to the light emitting element 12P in the column direction. The second lateral surface 21b of sapphire substrate 21 of the light emitting element 12R faces the first lateral surface 21a of the sapphire substrate 21 of the light emitting element 12S that is adjacent to the light emitting element 12R in the column direction. The first lateral surface 21a of the sapphire substrate 21 of the light emitting element 12S faces the second lateral surface 21b of the sapphire substrate 21 of the light emitting element 12T that is adjacent to the light emitting element 12S in the column direction. The pair of first lateral surfaces 21a of the sapphire substrate 21 of the light emitting element 12P are inclined in the opposite direction to the inclination of the first lateral surfaces 21a of the sapphire substrate 21 of the light emitting element 12S. In other words, the light emitting elements 12 are disposed such that in the column direction (from the top side to the bottom side in FIG. 1B), one of the pair of first lateral surfaces 21a of adjacent light emitting elements 12 are rotated by 90° to the left. In other words, among every two adjacent light emitting elements 12 in the column direction, the orientation of the light emitting element 12 on the bottom side is rotated by 90° to the left with respect to the orientation of the light emitting element 12 on the top side.

Such arrangement as described above can effectively prevent or reduce the successively continuing brighter pattern and the successively continuing darker pattern that have been occurred when a plurality of light emitting elements each having a relatively brighter side and a relatively darker side when viewed from above, are disposed regularly and in the same orientation. Accordingly, uniform intensity distribution of light can be obtained on the light emitting surface and visual recognition of unevenness in luminance can be avoided or reduced.

In particular, when not only the light emitting elements in the predetermined region but also all the light emitting elements on the wiring substrate 11 are disposed as described above, more uniform intensity distribution of light can be obtained on the light emitting surface and visual recognition of unevenness in luminance can be more effectively avoided or reduced.

Figure 3:
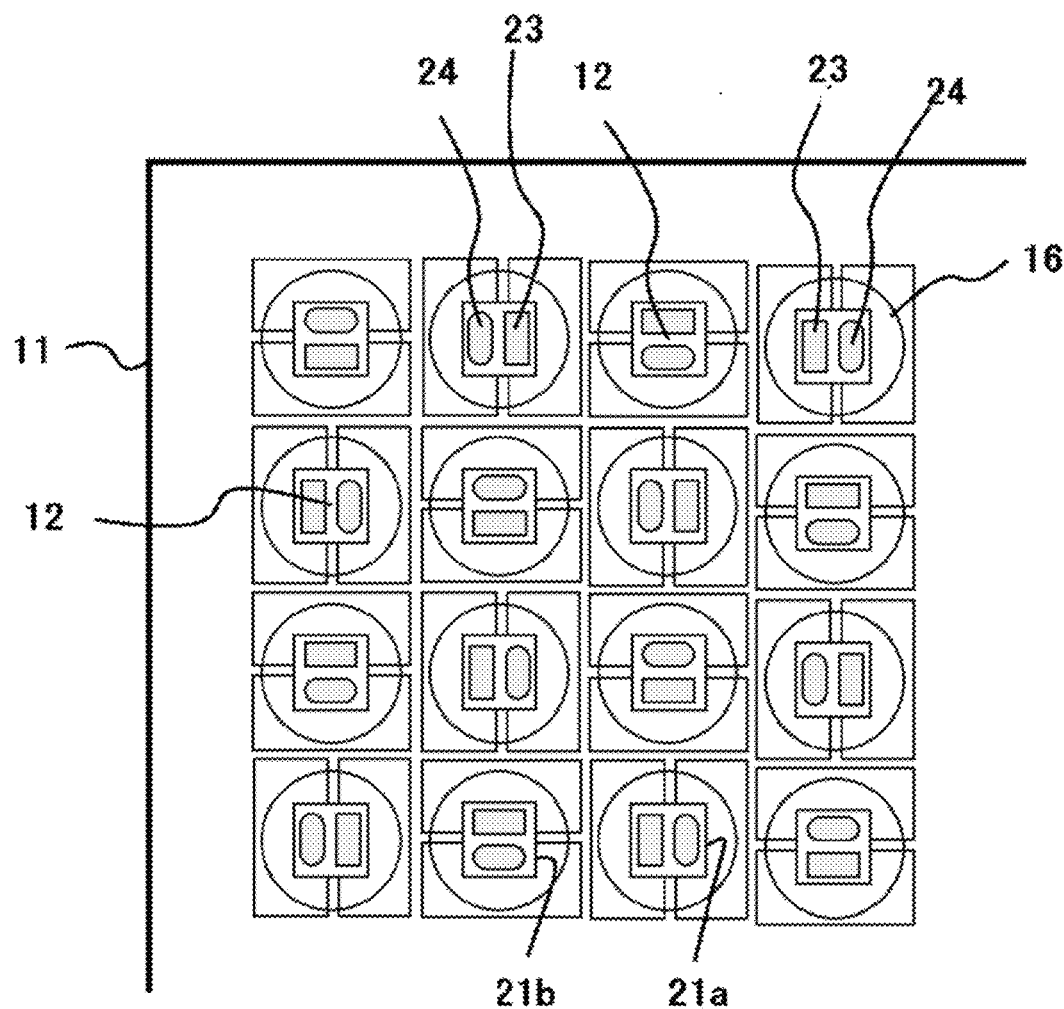
FIG. 3 is a schematic plan view illustrating an arrangement of light emitting elements in the region M of a light emitting device according to another embodiment.

As shown in FIG. 3, the plurality of light emitting elements 12 may be disposed such that one of the pair of first lateral surfaces 21a of adjacent light emitting elements 12 in the row direction (from the left side to the right side in FIG. 3) are rotated by 90° to the left, and one of the pair of first lateral surfaces 21a of adjacent light emitting elements 12 in the column direction (from the top side to the bottom side in FIG. 3) are rotated by 90° to the right. In other words, among every two adjacent light emitting elements 12 in the row direction, the orientation of the light emitting element 12 on the right side is rotated by 90° to the left with respect to the orientation of the light emitting element 12 on the left side. Among every two adjacent light emitting elements 12 in the column direction, the orientation of the light emitting element 12 on the bottom side is rotated by 90° to the right with respect to the orientation of the light emitting element 12 on the top side.

Alternatively, as shown in FIG. 4, the plurality of light emitting elements 12 may be disposed such that one of the pair of first lateral surfaces 21a of adjacent light emitting elements 12 in the row direction (from the left side to the right side in FIG. 4) are rotated by 45° to the right, and one of the pair of first lateral surfaces 21a of adjacent light emitting elements 12 in the column direction (from the top side to the bottom side in FIG. 4) are rotated by 45° to the right. In other words, among every two adjacent light emitting elements 12 in the row direction, the orientation of the light emitting element 12 on the right side is rotated by 45° to the right with respect to the orientation of the light emitting element 12 on the left side. Among every two adjacent light emitting elements 12 in the column direction, the orientation of the light emitting element 12 on the bottom side is rotated by 90° to the left with respect to the orientation of the light emitting element 12 on the top side. In a similar manner, the light emitting elements 12 may be rotated to the right from the top side to the bottom side in the column direction, and the light emitting elements 12 may be rotated to the left from the left side to the right side in the row direction. As shown in FIG. 4, in every adjacent ones of the light emitting elements 12 in the row direction and in the column direction, one of the pair of first lateral surfaces 21a of one of the light emitting elements 12 faces one of the pair of second lateral surfaces 21b of an adjacent one of the light emitting elements 12, while these facing surfaces are inclined at 45° with respect to each other.

Figure 5:
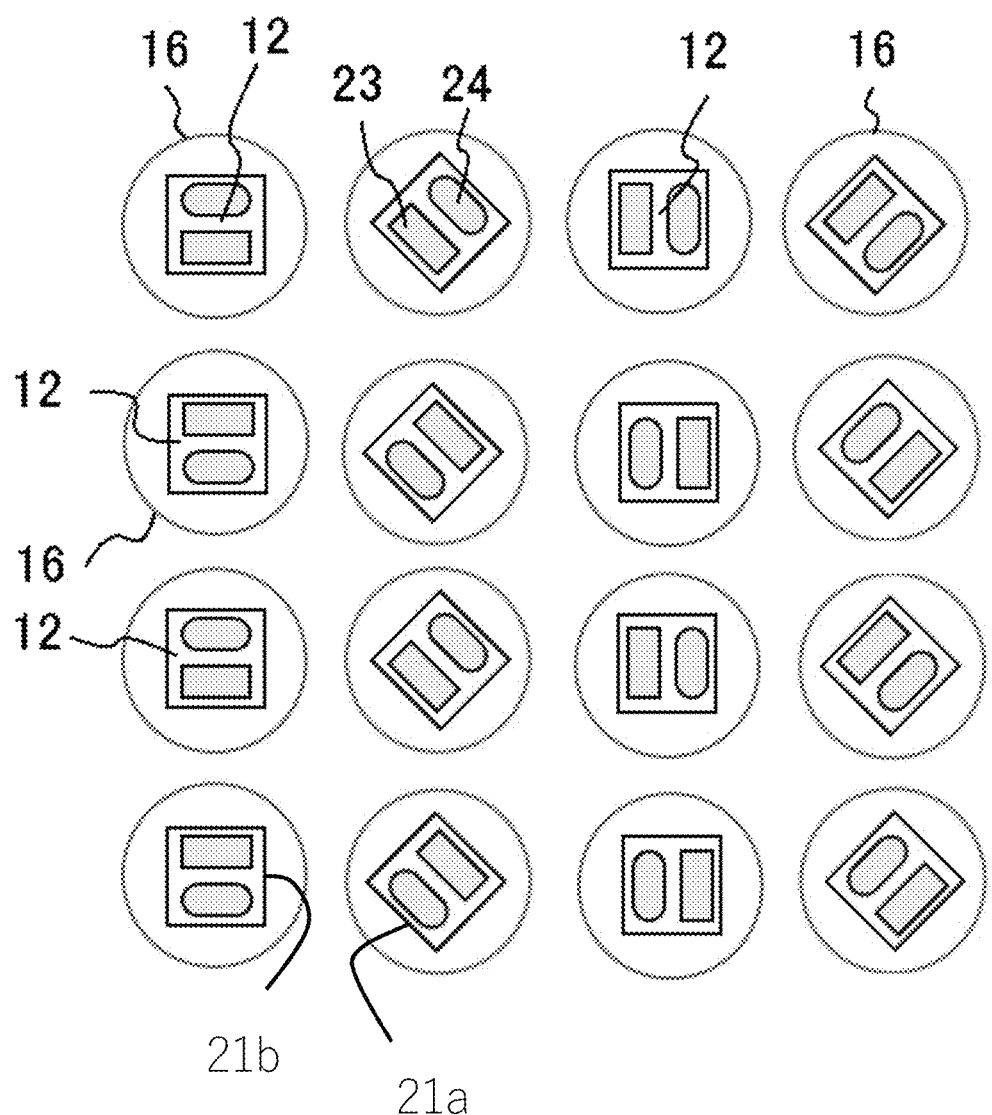
FIG. 5 is a schematic plan view illustrating an arrangement of light emitting elements in the region M of a light emitting device according to yet another embodiment.

Further, as shown in FIG. 5, the plurality of light emitting elements 12 may be disposed such that in the row direction (from the left side to the right side in FIG. 5), one of the pair of first lateral surfaces 21a of adjacent light emitting elements 12 are, for example, rotated by 45° to the right, and in the column direction, one of the pair of first lateral surfaces 21a of adjacent light emitting elements 12 are rotated by 180°. In other words, among every two adjacent light emitting elements 12 in the row direction, the orientation of the light emitting element 12 on the right side is rotated by 45° to the right with respect to the orientation of the light emitting element 12 on the left side. Among every two adjacent light emitting elements 12 in the column direction, the orientation of the light emitting element 12 on the bottom side is rotated by 180° with respect to the orientation of the light emitting element 12 on the top side. In this case shown in FIG. 5, the first lateral surface 21a of the light emitting elements 12 and the second lateral surface 21b of adjacent light emitting elements 12 are facing each other only in the row direction.

Although not shown in FIG. 4 and FIG. 5, the wiring 11a of the wiring substrate 11 can be appropriately disposed on the upper surface, on the lower surface, or inside of the wiring substrate 11, according to the arrangement of the light emitting element 12 as described.

Other than a rotation of the light emitting elements 12 at 45°, 90°, 180° or the like, a rotation of any appropriate angle can be applied to arrange the light emitting elements regularly or randomly.

Accordingly, the successively continuing brighter pattern and the successively continuing darker pattern can be efficiently avoided or reduced, and uniform intensity distribution of light can be obtained on the light emitting surface and visual recognition of unevenness in luminance can be avoided.

Underfill 15

Each of the light emitting elements 12 mounted on the upper surface of the wiring substrate 11 are preferably provided with an underfill 15 disposed around each of the light emitting elements 12 and/or between each of the light emitting elements 12 and corresponding portions of the wiring substrate 11. The underfill 15 may contain a filler, a pigment, or/and light-reflecting material etc., to obtain the thermal expansion coefficient closer to the thermal expansion coefficient of the light emitting elements 12, to prevent or reduce scattering and reflection of light from the light emitting elements 12 at the wiring substrate 11, and to extract light from the light emitting elements 12 efficiently to the opposite side of the wiring substrate 11.

The underfill 15 can be made of a material resistance to deterioration due to light from the light emitting elements 12. Examples of the materials of the underfill 15 include an epoxy resin, a silicone resin, a modified silicone resin, a urethane resin, an oxetane resin, an acrylic resin, a poly carbonate resin and a polyimide resin. With the use of the filler or pigment made of a material that absorbs emission wavelength of light, light is less likely reflected and scattering of light can be reduced or prevented. In order to prevent or reduce deterioration due to light, an inorganic compound is preferably used for the light-absorption material.

Sealing Member 16

Each of the light emitting elements 12 mounted on the upper surface of the wiring substrate 11 are preferably sealed with a sealing member 16.

The sealing member 16 may be formed with a light-transmissive material, examples thereof include, an epoxy resin, a silicone resin, a mixed resin of those, and glass. Of those, a silicone resin is preferably used in view of light-resisting properties and the ease of molding.

The sealing member 16 may be formed in a dome shape, a bowl shape, or the like, or such a shape with a depression corresponding to a center of a light emitting element 12. The sealing member 16 may also formed in a lens shape that can produce a batwing light distribution. The shape of the sealing member 16 on the wiring substrate 11 may be circular, or hexagonal or octagonal, or the like.

The sealing member 16 can be formed to cover the corresponding one or more light emitting elements 12 by using compression molding, injection molding, or the like. Also, the shape of the sealing member 16 can be controlled by using the surface tension of the material of the sealing member, in which the viscosity of the material of the sealing member 16 is optimized and applied it on the light emitting elements 12 in drops or by drawing.

Light-Diffusing Member 14

The light diffusing member 14 is disposed above the plurality of light emitting elements 12. The light diffusing member 14 may be provided for each group of light emitting elements 12, or a single light diffusing member 14 may be provided above all the light emitting elements 12 in the light emitting device. The light diffusing member 14 is preferably disposed above substantially in parallel to the upper surfaces of the light emitting elements 12. With the use of the light diffusing member 14 described above, light emitted from the plurality of light emitting elements 12 can be transmitted while further diffusing, and thus unevenness in luminance can be reduced.

In particular, when the light diffusing member 14 is used with the light emitting elements 12 each having the sapphire substrate that has the fast lateral surfaces 21a described above, contrast of relatively brighter sides and relatively darker sides of the light emitting elements when viewed from above tend to be increased. However, according to the present embodiment, the plurality of light emitting elements 12 are disposed in a matrix in which the first lateral surface 21a and the second lateral surface 21b of each adjacent two light emitting elements 12 face with each other, which offsets the successively continuing brighter pattern and the successively continuing darker pattern, and thus occurrence of unevenness in luminance can be efficiently avoided or reduced.

Examples of the materials of the light diffusing member 14 include materials of smaller absorption to visible light such as polycarbonate resins, polystyrene resins, acrylic resins, and polyethylene resins. In order to diffuse light, materials having different refractive index may be contained in the light diffusing member 14, or the surface may be textured to scatter light, or other appropriate methods may be employed.

In the light emitting device according to the present embodiment, a wavelength converting member may be disposed at front side or backside of the light diffusing member 14 with respect to light emitted from the light emitting elements 12. The wavelength converting member may be, for example, made of a light-transmissive resin containing one or more known fluorescent materials, or made of a sintered fluorescent material.

As described above, when a plurality of light emitting elements 12 each having a pair of first lateral surfaces 21a inclined to the lower surface 21c of the sapphire substrate 21 and a pair of second lateral surfaces 21b perpendicular to the lower surface 21c of the sapphire substrate 21 are disposed in a matrix of rows and columns on the light-reflecting substrate, and the light-reflecting film 13 and light diffusing member 14 are used in combination, occurrence of successively continuing brighter pattern and successively continuing darker pattern can be efficiently avoided or reduced by a simple method of changing the orientation of the light emitting elements in the matrix direction. Accordingly, uniform intensity distribution of light can be obtained on the light emitting surface and visual recognition of unevenness in luminance can be avoided.

The light emitting device according to the present disclosure can be suitably used for various display devices, luminaires, displays, backlight light sources of liquid crystal displays, further, for image reading apparatus for photocopiers, scanners, or the like, projectors, laser display devices, endoscopes, vehicular headlights, bar code scanners, or the like.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a wiring substrate having light-reflecting properties, the wiring substrate including a wiring;
    a plurality of light emitting elements mounted in a matrix of rows and columns on an upper surface of the wiring substrate, the light emitting elements each including
        a sapphire substrate having a lower surface, a pair of first lateral surfaces slanted with respect to the lower surface, and a pair of second lateral surfaces perpendicular to the lower surface, with the pair of first lateral surfaces has an acute angle lateral surface that forms an acute angle with the lower surface and an obtuse angle lateral surface that forms an obtuse angle with the lower surface in a cross-section passing through the lower surface and the pair of first lateral surfaces, and
        a semiconductor layered structure disposed on the lower surface of the sapphire substrate;
    a plurality of light-reflecting films respectively disposed on upper surfaces of the light emitting elements; and
    a light diffusing member disposed above the light emitting elements;
    wherein at least a group of the light emitting elements disposed in a predetermined region includes a first light emitting element, a second light emitting element and a third light emitting element arranged such that, the first light emitting element, the second light emitting element and the third light emitting element are aligned along one of a row direction and a column direction of the matrix with the second light emitting element being disposed between the first light emitting element and the third light emitting element, one of the acute angle lateral surface and the obtuse angle lateral surface of the first light emitting element faces one of the pair of second lateral surfaces of the second light emitting element, and one of the acute angle lateral surface and the obtuse angle lateral surface of the third light emitting element faces the other of the pair of second lateral surfaces of the second light emitting element.

2. The light emitting device according to claim 1, wherein the group of the light emitting elements are arranged such that, in every adjacent ones of the light emitting elements in both the row direction and the column direction of the matrix, one of the pair of first lateral surfaces of one of the light emitting elements faces one of the pair of second lateral surfaces of an adjacent one of the light emitting elements.

3. The light emitting device according to claim 1, wherein all of the light emitting elements are arranged such that, in every adjacent ones of the light emitting elements in at least one of the row direction and the column direction of the matrix, one of the pair of first lateral surfaces of one of the light emitting elements faces one of the pair of second lateral surfaces of an adjacent one of the light emitting elements.

4. The light emitting device according to claim 1, wherein the light-reflecting films are respectively disposed on the upper surfaces of the light emitting elements so that each of the light emitting elements provided with a corresponding one of the light-reflecting films has batwing light distribution characteristics.

5. The light emitting device according to claim 1, wherein each of the light emitting elements has a pair of electrodes at a lower surface side of the semiconductor layered structure with the pair of electrodes being connected to the wiring so that each of the light emitting elements is mounted on the wiring substrate in a flip-chip manner.

6. The light emitting device according to claim 1, wherein the light emitting device is a direct-lit backlight light source.

7. The light emitting device according to claim 1, wherein the group of the light emitting elements are arranged such that, in every adjacent ones of the light emitting elements in at least one of the row direction and the column direction of the matrix, the pair of first lateral surfaces of the one of the light emitting elements is substantially parallel to the pair of second lateral surfaces of the adjacent one of the light emitting elements in a plan view.

8. The light emitting device according to claim 2, wherein the group of the light emitting elements are arranged such that, in every adjacent ones of the light emitting elements in both the row direction and the column direction of the matrix, the pair of first lateral surfaces of the one of the light emitting elements is substantially parallel to the pair of second lateral surfaces of the adjacent one of the light emitting elements in a plan view.

9. The light emitting device according to claim 1, wherein the group of the light emitting elements are arranged such that, in every adjacent ones of the light emitting elements in at least one of the row direction and the column direction of the matrix, the pair of first lateral surfaces of the one of the light emitting elements is slanted with respect to the pair of second lateral surfaces of the adjacent one of the light emitting elements in a plan view.

10. The light emitting device according to claim 2, wherein the group of the light emitting elements are arranged such that, in every adjacent ones of the light emitting elements in both the row direction and the column direction of the matrix, the pair of first lateral surfaces of the one of the light emitting elements is slanted with respect to the pair of second lateral surfaces of the adjacent one of the light emitting elements in a plan view.

11. The light emitting device according to claim 1, wherein the obtuse angle lateral surface of the first light emitting element faces the one of the pair of second lateral surfaces of the second light emitting element, and the obtuse angle lateral surface of the third light emitting element faces the other of the pair of second lateral surfaces of the second light emitting element.

* * * * *